United States Patent [19]

Drake et al.

[11] Patent Number: 5,124,988

[45] Date of Patent: Jun. 23, 1992

[54] DUMP VALVE OPERATIONAL FAULT-DETERMINATION SYSTEM

[75] Inventors: John W. Drake, Greenville; James A. Wood, Spartanburg, both of S.C.

[73] Assignee: Westinghouse Air Brake Company, Wilmerding, Pa.

[21] Appl. No.: 543,504

[22] Filed: Jun. 25, 1990

[51] Int. Cl.$^5$ .......................................... G01R 31/28
[52] U.S. Cl. ..................... 371/15.1; 303/95; 303/92; 364/426.02; 371/29.1
[58] Field of Search .............. 371/15.1, 29.1, 57.1; 303/3, 15, 92, 95; 364/426.02, 426.01

[56] References Cited

U.S. PATENT DOCUMENTS

| | | | |
|---|---|---|---|
| 4,320,506 | 3/1982 | Farazi et al. | 371/20 |
| 4,389,710 | 6/1983 | Rasmussen | 364/551 |
| 4,709,341 | 11/1987 | Matsuda | 364/550 |
| 4,745,542 | 5/1988 | Baba et al. | 364/184 |
| 4,817,418 | 4/1989 | Asami et al. | 73/118.1 |
| 4,843,557 | 6/1989 | Ina et al. | 364/431.77 |
| 4,972,145 | 11/1990 | Wood et al. | 324/160 |
| 4,979,391 | 12/1990 | Drake et al. | 73/129 |
| 4,999,779 | 3/1991 | Wood et al. | 364/426.02 |

*Primary Examiner*—Jerry Smith
*Assistant Examiner*—Ly V. Hua
*Attorney, Agent, or Firm*—J. B. Sotak

[57] ABSTRACT

A dynamic diagnostic operational dump valve fault-detection system including a first logic network connected to a release reset circuit and to an applied reset circuit, the release reset circuit connected to a release timer circuit and a release flag circuit as well as to a release pressure check circuit, the applied reset circuit connected to an applied timer circuit and to an applied flag circuit as well as to an applied pressure check circuit, the release timer circuit and the release flag circuit connected to a second logic network and to a third logic network, the applied timer circuit and the applied flag circuit connected to the second logic network and to the third logic network, a magnet valve state comparison circuit connected to a fourth logic network, the third and the fourth logic network connected to an error output circuit for recording and displaying a dump valve failure.

21 Claims, 2 Drawing Sheets

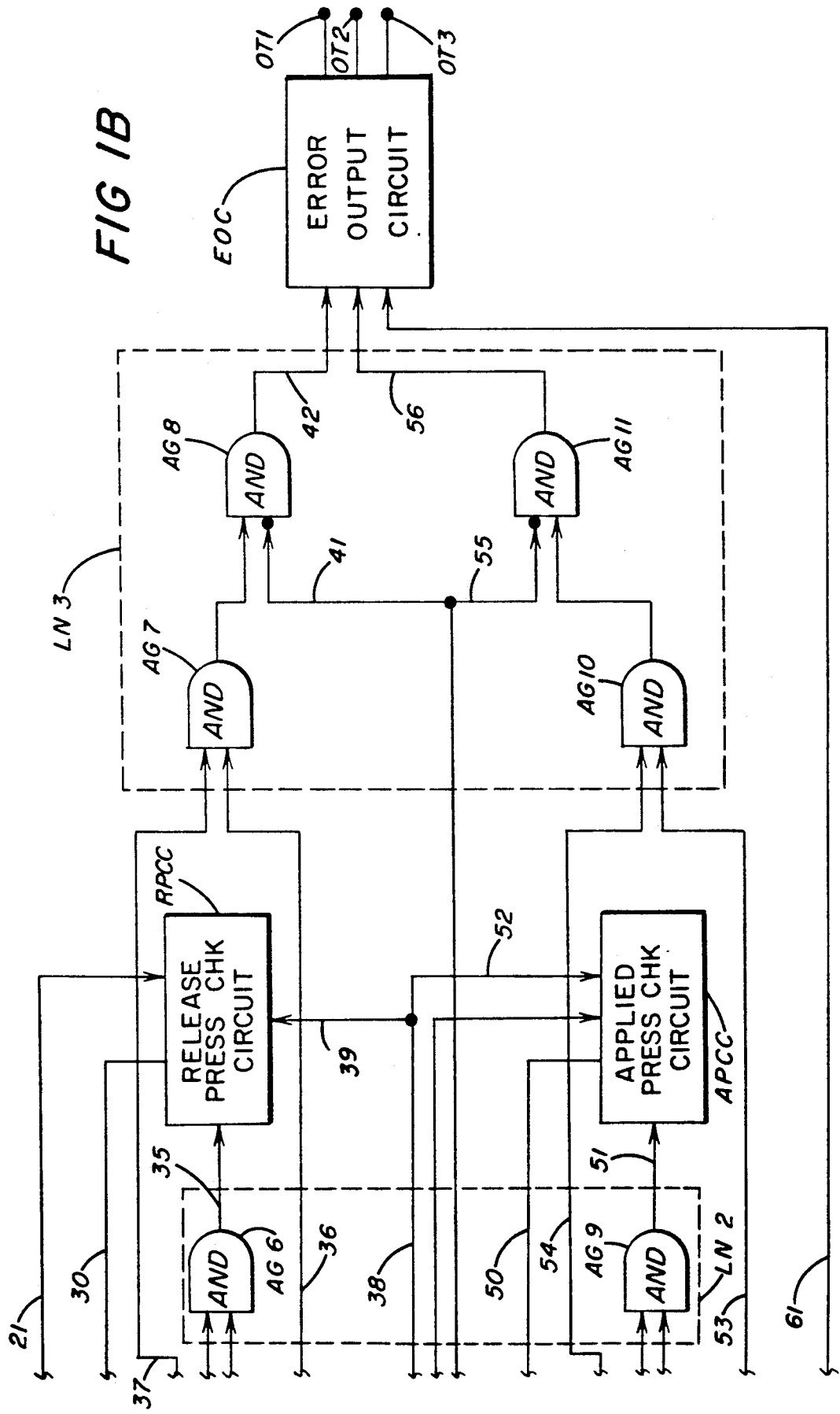

DUMP VALVE OPERATIONAL FAULT-DETERMINATION SYSTEM

FIELD OF THE INVENTION

This invention relates to a dump valve operational fault-detection arrangement and, more particularly, to an electronic dynamic diagnostic arrangement for detecting an electrical and/or mechanical fault of a dump valve which is used in conjunction with a wheel slip control system on a railway vehicle.

BACKGROUND OF THE INVENTION

It will be appreciated that, in railroad and/or mass and rapid transit operations, it is necessary to determine when an electropneumatic dump valve, such as, a type N-7-D magnet valve, has failed since the failure may result in the inability to release the brakes during a wheel slip condition. Normally, the dump valve is pneumatically interposed between the brake cylinder and a suitable source of fluid pressure, such as, a pneumatic brake control valve, so that during braking of the railway vehicle, the brake cylinder is pressurized to cause application of the brakes. Now when a wheel slip condition occurs, it is desirable to deactivate or release the brakes by electrically energizing the coil portion of the dump valve so that the valve portion is mechanically shifted to a position which blocks off the pressure from the pneumatic brake control valve and exhausts the brake cylinder to atmosphere. In some situations, a faulty dump valve may inhibit the actuation of the wheel slip control. That is, if the coil portion fails due to a short or open circuit, the solenoid plunger cannot functionally cause a common port to be connected to one or the other ports. Similarly, a mechanical failure results in the inability of connecting the common port with one or the other ports. Thus, it is highly advantageous to monitor the integrity of the dump valve to ascertain the electrical state, as well as the mechanical condition in order to forewarn and alert an end user of a possible approaching problem which could result in damage to the equipment and lading.

OBJECTS AND SUMMARY OF THE INVENTION

Accordingly, it is an object of this invention to provide a unique dump valve operational fault-detection arrangement for a railway braking system.

Another object of this invention is to provide an electropneumatic dump valve operational fault-detecting system for differentiating between an electronically related problem and a mechanically related problem.

A further object of this invention is to provide a dynamic process of checking both the mechanical and electrical components of a dump valve of the braking system for a railway vehicle.

Still another object of this invention is to provide a detection circuit which functions in a dynamic manner for continuously monitoring the operational status of a dump valve employed in a wheel slip control system of railway braking equipment.

Still a further object of this invention is to provide a faulty dump valve detection system for dynamically diagnosing the operational condition of the electrical and mechanical portions of an electropneumatic dump valve used in a wheel slip control system.

Yet another object of this invention is to provide a dynamic diagnostic operational dump valve fault detection system comprising, a first logic network means being connected to a release reset circuit means and to an applied reset circuit means, said release reset circuit means being connected to a release timer circuit means and a release flag circuit means, as well as to a release pressure check circuit means, said applied reset circuit means being connected to an applied timer circuit means and to an applied flag circuit means, as well as to an applied pressure check circuit means, said release timer circuit means and said release flag circuit means being connected to a second logic network means and to a third logic network means, said applied timer circuit and said applied flag circuit means being connected to said second logic network means and to said third logic network means, a magnet valve state comparison circuit means being connected to a fourth logic network means, said third and fourth logic network means being connected to an error output circuit means for recording and displaying a dump valve failure.

Still a further object of this invention is to provide a dump valve operational fault determination arrangement comprising, a first multiple-stage AND logic network for receiving a plurality of logical input signals representative of various operating conditions of a railway vehicle, said first multiple-stage AND logic network supplying a logic output signal to a release reset circuit and supplying a logic output signal to an applied reset circuit, said release reset circuit is connected to a release timer circuit and to a release flag circuit, said applied reset circuit is connected to an applied timer circuit and to an applied flag circuit, said release timer circuit and said release flag circuit supplying a logic input signal to a second multiple-stage AND logic network and to a third multiple-stage AND logic network, said applied timer circuit and said applied flag circuit supplying a logic input signal to said second multiple-stage AND logic network and to said third multiple-stage AND logic network, said second multiple-stage AND logic network supplying a logic input signal to a release pressure check circuit which supplies a reset signal to said release flag circuit, said third multiple-stage AND logic network and a single-stage AND logic network connected to an error output circuit which outputs an error signal to record and display a dump valve failure, said second multiple-stage AND logic network supplying a logic input signal to an applied pressure check circuit which supplies a reset signal to said applied flag circuit, and said third multiple-stage AND logic network and said single-stage AND logic network connected to said error output circuit which outputs an error signal to record and display a dump valve failure.

DESCRIPTION OF THE DRAWINGS

The above objects and other attendant features and advantages will be more readily appreciated as the present invention becomes better understood by reference to the following detailed description when considered in conjunction with the accompanying drawings, wherein:

FIGS. 1A and 1B show a schematic circuit block diagram, when placed together, of a dump valve operational fault detection arrangement for use in conjunction with a wheel slip control system for railway braking equipment.

DETAILED DESCRIPTION OF THE INVENTION

Figure 1A:
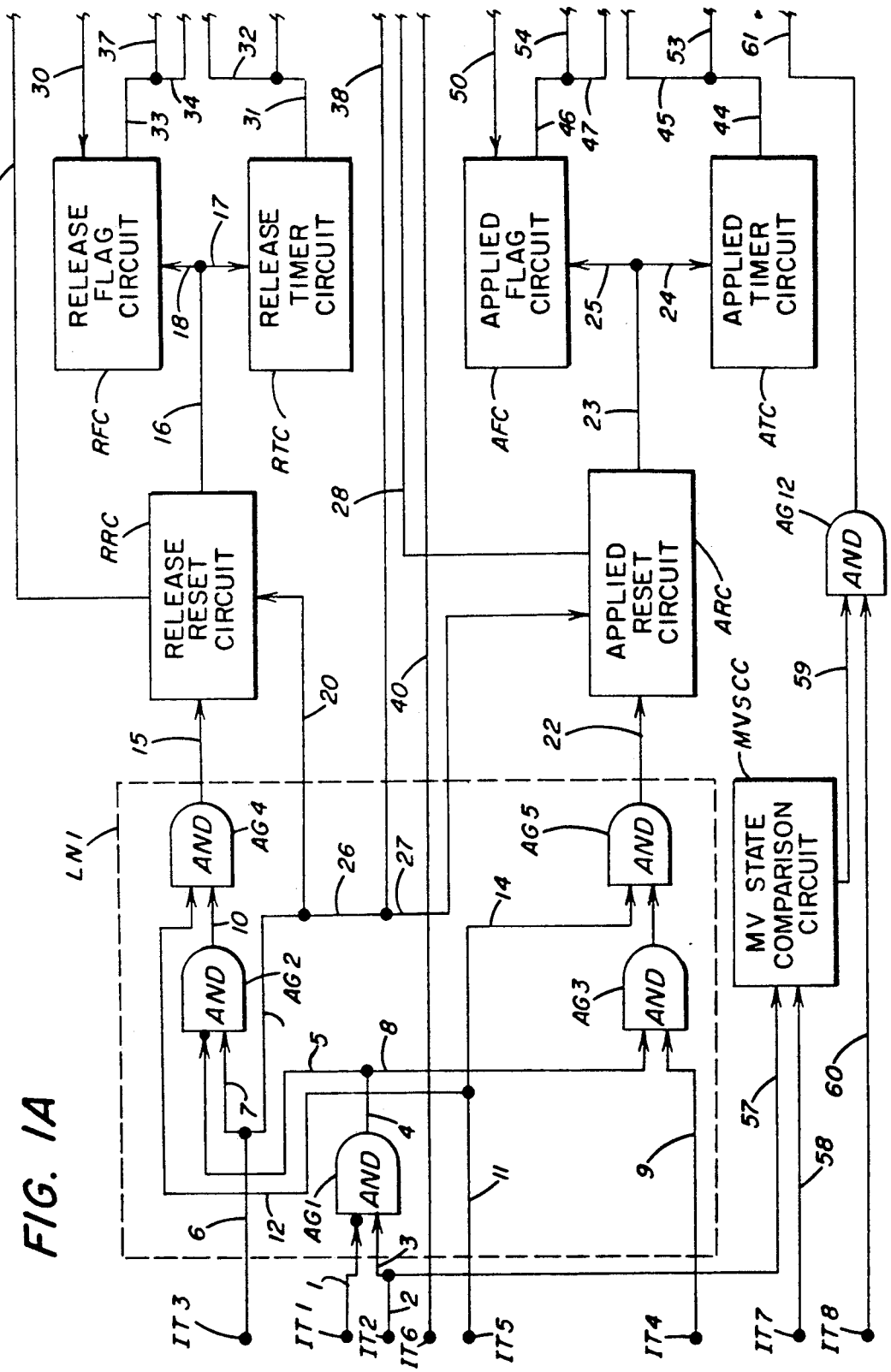

Referring now to the drawings and in particular to FIGS. 1A and 1B which, when placed in side-by-side relationship, illustrate a schematic circuit block diagram of the dump valve operational fault-detection system in accordance with the present invention. It will be appreciated that the fault-detection circuit includes a plurality of logic networks which are suitable electrically interconnected to appropriate electronic circuits for performing the unique functional operation of the subject invention.

As shown, a first multiple-stage logic network LN1 includes a first two-input AND gate circuit AG1 which has one input connected to terminal IT1 via lead 1 while the other input is connected to terminal IT2 via leads 2 and 3. The logic input signal appearing on terminal IT1 is derived from a previous magnet valve (Prev-MV) output sensor which is representative or indicative of the prior condition or state to which the magnet valve was commanded in the previous program cycle. Accordingly, if the magnet valve was previously commanded to an application state, the logic signal on terminal IT1 is a high or logical "1". Conversely, if the magnet valve was previously commanded to a release state or lap condition, the logic signal on terminal IT1 is a low or logical "0". It will be noted that this signal is inverted before being conveyed to the input of the gate AG1. The logic input signal appearing on terminal IT2 is derived from the magnet valve (MV) output sensor which is representative or indicative of the present state of the magnet valve and which is commanded to in the present or existing program cycle. Now if the magnet valve is presently commanded to an application state, the logic signal on terminal IT2 is a high or logical "1", and if the magnet valve is commanded to a release or lap state, the logical signal on terminal IT2 is a low or logical "0".

It will be seen that the first logic network LN1 also includes a second two-input AND gate circuit AG2 which has one input which is inverted and is connected to the output of the first AND gate AG1 via leads 4 and 5 while the other input is connected to terminal IT3 via leads 6 and 7. The logic input signal appearing on terminal IT3 is derived from the truck brake cylinder (BC) pressure sensor which is an input voltage that directly corresponds to the actual air pressure reading present in the brake cylinder for the specific truck on the vehicle. If the equivalent voltage signal is produced by truck BC pressure that is greater than twenty-five pounds per square inch (25 psig), then the input signal is a high or logical "1" and if not, the input signal is a low or logical "0".

It will be noted that the first logic network LN1 also includes a third two-input AND gate circuit AG3 which has one input connected to the output of the first AND gate AG1 via leads 4 and 8 while the other input is connected to terminal IT4 via lead 9. The logic input signal appearing on terminal IT4 is received from a brake force motor current (FMC) sensor. The electric force motor produces a force which is proportional to the electric input current. This force is balanced against the constant area within an exhaust seat. When the electric current in the coil is raised, the output force will increase. If the brake FMC signal is equal to or less than a current value of 310 milliamperes (ma), the input signal is a high or logical "1" and if not, the input signal is a low or logical "0".

As shown, the first logic network LN1 also includes a fourth two-input AND gate circuit AG4 and a fifth two-input AND gate circuit AG5. The fourth AND gate AG4 has one input connected to the output of the second AND gate AG2 via lead 10 and has the other input connected to terminal IT5 via leads 11 and 12. The logic input signal appearing at terminal IT5 is derived from a truck transducer operational pressure (TOP) fault sensor which provides the present status of the truck brake cylinder transducer. If the transducer is functional, the truck TOP fault signal is a high or logical "1", and if not, it is a low or logical "0". It will be observed that the fifth AND gate AG5 has one input connected to the output of the third AND gate AG3 via lead 13 and has the other input connected to terminal IT5 via leads 11 and 14.

The output of the fourth AND gate AG4 is connected by lead 15 to the input of a release reset circuit RRC which conveys a reset signal to a release timer circuit RTC via leads 16 and 17 and to a release flag circuit RFC via leads 16 and 18, when the input from the fourth AND gate AG4 is a high or logical "1". The release reset circuit RRC also receives a truck BC pressure signal from terminal IT3 via leads 6, 19 and 20 which is conveyed to the input of a release pressure check circuit RPCC via lead 21. The release reset circuit RRC is inactive under any other conditions.

As shown, the output of the fifth AND gate AG5 is connected by lead 22 to the input of an applied reset circuit ARC which conveys a reset signal to an applied timer circuit ATC via leads 23 and 24 and to an applied flag circuit via leads 23 and 25, when the input from the fifth AND gate AG5 is a high or logical "1". The applied reset circuit ARC also receives a truck BC pressure signal from terminal IT3 via leads 6, 19, 20 and 27 which is conveyed to the input of an applied pressure check circuit APCC via lead 28. The applied reset circuit ARC is inactive under any other conditions.

The release timer circuit RTC is an incrementing timing circuit. When the releasing timing circuit RTC receives a reset pulse, the count of the timer is reset to zero (0). If the release timer count, namely, an elapsed time counter, is less than the time-out period, which is set at one hundred milliseconds (100 ms), the release timer circuit RTC outputs a low or logical "0". Conversely, when the release timer count is greater than the 100 ms time-out period, the release timer circuit RTC outputs a high or logical "1".

It will be seen that the output of the release press check circuit RPCC is connected by lead 30 to the input of the release flag circuit RFC. If the input from the release reset circuit RRC takes the form of a reset pulse, the release flag circuit RFC outputs a high or logical "1". The output of the release flag circuit RFC remains in a high or logical "1" state until a reset pulse is received from the release pressure check circuit RPCC via lead 30. The latter reset pulse results in a transition in which the output of the release flag circuit RFC goes to a low or logical "0".

As shown, a second multiple-stage logic network LN2 includes a first two-input AND gate circuit AG6. The output of the release timer circuit RTC is connected by leads 31 and 32 to one input of the first two-input AND gate circuit AG6 while the output of release flag circuit RFC is connected by leads 33 and 34 to the other input of the AND gate circuit AG6. It will be seen that the output of the AND gate AG6 is connected by lead 35 to one input of the release pressure check circuit RPCC. As previously noted, the output of the release reset circuit RRC is also connected by lead 21 to another input of the release pressure check circuit RPCC and the truck BC pressure input signal on terminal IT3 in the form of a voltage directly corresponding to the present air pressure reading is fed to a further input of the release pressure check circuit RPCC via leads 6, 19, 26, 38, and 39. When the input signal from the AND gate AG6 is a low or logical "0", the release pressure check circuit RPCC compares the output voltage of the release reset circuit RRC with the output voltage of the truck BC pressure on terminal IT3. If the voltage difference is equal to or is greater than 2 psig, a reset pulse is produced by the release pressure check circuit RPCC which is fed to the release flag circuit RFC via lead 30.

As shown, a third multiple-stage logic network LN3 includes a first two-input AND gate circuit AG7. The output of the release timer circuit RTC is connected by leads 31 and 36 to one input of the first two-input AND gate circuit AG7 while the output of the release flag circuit RFC is also connected by leads 33 and 37 to the other input of the AND gate AG7. Now when the release reset circuit RRC and the release flag circuit RFC both supply a high or logical "1" to the two inputs of the AND gate AG7, the gate circuit AG7 outputs a high or logical "1" by lead 63 to one input of a second two-input AND gate circuit AG8 of the third logic network LN3. Otherwise, the AND gate AG7 outputs a low or logical "0" to the one input of AND gate AG8. The other inverted input of the AND gate AG8 is connected to terminal IT6 via leads 40 AND 41. The logic input signal developed on terminal IT6 is derived from a safety timer circuit which keeps track of the amount of time that the dump valve is in a release state during a wheel slip correction phase. If the count of the safety timer is less than a preselected value, namely, three (3) seconds, the safety timer outputs a low or logical "0"; otherwise, it outputs a high or logical "1". It will be seen that the output of AND gate AG8 is connected by lead 42 to a first input of a multi-input error output circuit EOC.

As shown, the second logic network LN2 also includes a second two-input AND gate circuit AG9. The output of the applied timer circuit ATC is connected by leads 44 and 45 to one input of the second AND gate AG9 while the output of the applied flag circuit is connected by leads 46 and 47 to the other input of the AND gate AG9.

The applied timer circuit ATC is also an incrementing timing circuit. When the applied timing circuit ATC receives a reset pulse, the count of the timer is reset to zero (0). If the release timer count, namely, an elapsed time counter, is less than the timeout period, which is set at one hundred milliseconds (100 ms), the applied timer circuit ATC outputs a low or logical "0". Conversely, when the applied timer circuit is greater than 100 ms timeout interval, the applied timer circuit ATC outputs a high or logical "1". It will be observed that the output of applied pressure check circuit APCC is connected by lead 50 to the input of the applied flag circuit AFC. If the input signal from the applied reset circuit is a reset pulse, the applied flag circuit AFC outputs a high or logical "1". The output of the applied flag circuit AFC remains in a high or logical "1" state until another reset pulse is received from the applied pressure check circuit APCC via lead 50. The latter reset pulse causes a transition in which the output of the applied flag circuit AFC goes to a low or logical "0". As shown, the output of the AND gate AG9 is connected to one input of the applied pressure check circuit APCC via lead 51. As mentioned above, the output of the applied reset circuit is also connected by lead 28 to another input of the applied pressure check circuit APCC and the truck BC pressure input signal on terminal IT3 in the form of a voltage directly corresponding to the present air pressure reading is fed to a further input of the applied pressure check circuit APCC via leads 6, 19, 26, 38, and 52. When the input signal from the AND gate AG9 is a low or logical "0", the applied pressure check circuit APCC compares the output voltage of the applied reset circuit ARC with the output voltage of the truck BC pressure on terminal IT3. If the voltage difference is equivalent to or greater than a representative 2 psig, a reset pulse is produced by the applied pressure check circuit APCC which is conveyed to the applied flag circuit AFC.

It will be noted that the third logic network LN3 includes a third two-input AND gate circuit AG10. The output applied timer circuit ATC is also connected by leads 44 and 53 to one input of AND gate AG10 while the output of the applied flag circuit AFC is also connected to the other input of the AND gate AG10 via leads 46 and 54. Now when the applied timer circuit ATC and the applied flag circuit AFC both supply a high or logical "1" to the two inputs of the AND gate AG10, the gate circuit AG10 outputs a high or logical "1" by lead 64 to one input of a fourth two-input AND gate circuit AG11 of the third logic network LN3. Otherwise, the AND gate AG10 outputs a low or logical "0" to the one input of the AND gate AG11. The other inverter input of the AND gate 11 is connected to terminal IT6 via leads 40 and 55. As previously mentioned, the logic input signal developed on terminal IT6 is derived from a safety timer circuit which monitors the amount of time that the dump valve is released during a wheel slip correction control period. If the count of the safety timer is less than three (3) seconds, the safety timer outputs a low or logical "0". Conversely, if the safety timer is equal to or is greater than three (3) seconds, it outputs a high or logical "1". As shown, the output of AND gate AG11 is connected by lead 56 a second input of the error output circuit EOC.

As shown in FIG. 1A, a magnet valve (MV) state comparison circuit MVSCC has one input connected to terminal IT2 via leads 2 and 57 and has another input connected to terminal IT7 via lead 58. As previously mentioned, the logic input signal appearing on terminal IT2 is developed by a magnet valve (MV) output sensor which designates the present state that the magnet valve is commanded in the existing program cycle. If the magnet valve is presently commanded to an application state, the logic signal on terminal IT2 is a high or logical "1". Conversely, if the magnet valve is presently commanded to a release or lap state, the logic signal appearing on terminal IT2 would be a low or logical "0". The logic input signal appearing on terminal IT7 signifies the magnet valve coil feedback status. If the magnet valve is in an application state, the logic signal on terminal IT7 is a high or logical "1". On the other hand, if the magnet valve is in a release or lap state, the logic signal on terminal IT7 is a low or logical "0". Thus, the MV state comparison circuit MVSCC checks or compares if there is a difference in the state of the present MV output signal and in the state of the magnet valve feedback signal. If a state difference between the two signals exists for a time period exceeding two hundred milliseconds (200 ms), the comparison circuit will output a high or logical "1" on lead 59 which is fed to one input of a two-input AND gate circuit AG12 of a fourth logic network. As shown, the other input of the AND gate AG12 is connected to a terminal IT8 via lead 60. The logic input signal appearing on terminal IT8 is derived from the highest speed determination signal sensor which provides the highest speed currently registered by an axle on the given selected truck. If the highest speed signal is equal to or greater than three miles per hour (3 mph), the logic signal on terminal IT8 is a high or logical "1". Under any other condition, the logic signal on terminal IT8 is a low or logical "0". If the input signal from the MV state comparison circuit MVSCC and the highest speed determination sensor produce a high or logical "1", the output of AND gate AG12 is a high or logical "1"; otherwise, the output of AND gate AG12 is a low or logical "0". As shown, the output of the AND gate AG12 is connected by lead 61 to a third input of the error output circuit EOC.

As noted above, the output of the AND gate AG8 is applied to the first input of the error output circuit EOC, the output of the AND gate AG11 is applied to the second input of the error output circuit EOC, and the output of the AND gate AG12 is applied to the third input of the error output circuit EOC. Let us now analyze the operation of the error output circuit EOC. It will be seen that the error output circuit EOC has three output terminals OT1, OT2, and OT3. The terminal OT1 is connected to a diagnostic module, the terminal OT2 is connected to a failure code random access memory (RAM) and the terminal OT3 is connected to a magnet valve cutout relay circuit.

If the logic input signal received from the AND gate AG8 is a high or logical "1", the error output circuit EOC results in the following:

1. The error output circuit EOC conveys a high or logical "1" to terminal OT2 and, in turn, to the failure code RAM to record a truck specific dump valve failure. Under this condition, a specific mnemonic is displayed of the light-emitting diodes (LEDs) which is "1d" or "2d".

2. The error output circuit EOC outputs a high or logical "1" to terminal OT2 and, in turn, to the failure code RAM to record a truck general dump valve failure. The specific mnemonic displayed on the LEDs is "d1" or "d2".

Now if the logic input signal received from the AND gate AG11 is a high or logical "1", the error output circuit EOC performs the following:

1. The error output circuit EOC outputs a high or logical "1" to terminal OT2, and, in turn, to the failure code RAM to record a truck specific dump valve failure. At this time, the specific mnemonic displayed on the LEDs is "3d" or "4d".

2. The error output circuit EOC conveys a high or logical "1" to terminal OT2 which is fed to the failure code RAM to record a truck general dump valve state failure. In this case, the specific mnemonic characters which are displayed on the LEDs are "d1" or "d2".

If the logic input signal received from the AND gate AG12 is a high or logical "1", the error output circuit EOC carries out the following:

1. The error output circuit EOC feeds a high or logical "1" to the failure code RAM to signify that a truck specific state failure has occurred, and the specific mnemonic displayed on the LEDs is "53" or "54".

2. The error output circuit EOC conveys a high or logical "1" to the failure code RAM to log a truck general dump valve failure. In this case, the specific mnemonic displayed on the LEDs is "d1" or "d2".

3. The error output circuit EOC outputs a high or logical "1" to terminal OT3 which is fed to the magnet valve cutout relay circuit to disable the software control over the magnet valve electronic circuitry. Accordingly, the magnet valve reverts to an application state.

Conversely, if the logic input signals of both AND gate AG8 and AND gate AG11 are low, the error output circuit EOC remains inactive.

Thus, the routine dump valve check verifies that both the mechanical and electrical elements of the dump valve are operational. The design implementation promotes to eliminate the faulty detection of a non-operational dump valve through the use of specific pattern faults and fault tolerances during the diagnostic delineation.

Thus, the circuitry performs the mechanical check by polling the specific car inputs and by determining the present status of the given car. If the present status of the car is equivalent to a specific car condition, the brake cylinder pressure is recorded and the test timer is started. When the time period of the test timer has expired, the present brake cylinder pressure is compared with the recorded brake cylinder pressure. If pressure differential is equal to or greater than 2 psig, then the dump valve is considered to be operational. If the pressure differential is less than 2 psig, an inoperative dump valve determination test is initiated. This test verifies a correct status for each of the dump valve specific car inputs which is used to eliminate an erroneous diagnosis of an inoperative dump valve. If the test confirms a correct status of each of the dump valve specific car inputs, an inoperative dump valve system error is reported to the system error log. If any other test condition exists, an error is not reported.

It will be appreciated that the circuitry also performs the electronic check by polling the highest speed detection circuit and the magnet valve feedback circuit. If the status of the two circuits is equivalent to a specific condition, a test timer is started. When the time period of the test timer has expired, a test of comparing the required state of the magnet valve to the actual magnet valve feedback is performed. If a difference between the states exists, an erroneous magnet valve state error is reported to the system error log. If any other test condition prevails, an error is not reported.

Accordingly, the primary emphasis of the present dump valve operational fault processing system is to avoid unnecessary preventative maintenance to the lowest level replaceable unit by the ultimate user. The system is designed as an artificially intelligent process which monitors select functions for preventing erroneous results that can cause a faulty diagnosis of an operational dump valve. This process system is used to alert the ultimate user of a possible or actual problem in advance of the development of a detrimental maintenance condition on the car. The present system may also be used for supplying important valve feedback information for other valve safety processing systems and provides the necessary detailed dynamic diagnostic information for the detection of a specific dump valve fault. Thus, this diagnostic information may be efficaciously utilized by the ultimate user to effectively diagnose and appropriately replace a specific faulty dump valve.

Thus, the present invention has been described in such full, clear, concise, and exact terms as to enable any person skilled in the art to which it pertains to make and use the same, and having set forth the best mode contemplated of carrying out this invention. We state that the subject matter, which we regard as being our invention, is particularly pointed out and distinctly asserted in what is claimed. It will be understood that various alterations and changes may be made by those skilled in the art without departing from the spirit and scope of the subject invention. Further, with the advent of microprocessors and minicomputers, it is evident that the various functions and operations may be carried out and processed by a suitably programmed computer which receives the different inputs and produces the appropriate outputs. Therefore, it will be appreciated that certain modifications, ramifications, and equivalents will be readily apparent to persons skilled in the art and, accordingly, it is understood that the present invention should not be limited to the exact embodiment shown and described, but should be accorded the full scope and protection of the appended claims.

We claim:

1. A dynamic diagnostic operational dump valve fault-detection system comprising, a first logic network means being connected to a release reset circuit means and to an applied reset circuit means, said release reset circuit means being connected to a release timer circuit means and a release flag circuit means as well as to a release pressure check circuit means, said applied reset circuit means being connected to an applied timer circuit means and to an applied flag circuit means as well as to an applied pressure check circuit means, said release timer circuit means and said release flag circuit means being connected to a second logic network means and to a third logic network means, said applied timer circuit means and said applied flag circuit means being connected to said second logic network means and to said third logic network means, a magnet valve state comparison circuit means being connected to a fourth logic network means, said third and fourth logic network means being connected to an error output circuit means for recording and displaying a dump valve failure.

2. The dynamic diagnostic operational dump valve fault-detection system as defined in claim 1, wherein said first logic network means includes a plurality of AND gates.

3. The dynamic diagnostic operational dump valve fault-detection system as defined in claim 2, wherein each of said plurality of AND gates is a two-input circuit.

4. The dynamic diagnostic operational dump valve fault-detection system as defined in claim 1, wherein said second logic network means includes a plurality of AND gates.

5. The dynamic diagnostic operational dump valve fault-detection system as defined in claim 4, wherein each of said plurality of AND gates is a two-input circuit.

6. The dynamic diagnostic operational dump valve fault-detection system as defined in claim 1, wherein said third logic network means includes a plurality of AND gates.

7. The dynamic diagnostic operational dump valve fault-detection system as defined in claim 6, wherein each of said plurality of AND gates is a two-input circuit.

8. The dynamic diagnostic operational dump valve fault-detection system as defined in claim 1, wherein said fourth logic network means includes an AND gate.

9. The dynamic diagnostic operational dump valve fault-detection system as defined in claim 8, wherein said AND gate is a two-input circuit.

10. The dynamic diagnostic operational dump valve fault-detection system as defined in claim 1, wherein said first logic network means includes at least five two-input AND gate circuits.

11. The dynamic diagnostic operational dump valve fault-detection system as defined in claim 10, wherein a first AND gate circuit of said five two-input AND gate circuits has one logic input signal representative of a previous magnet valve condition and has another logic input signal representative of the present magnet valve condition.

12. The dynamic diagnostic operational dump valve fault-detection system as defined in claim 11, wherein a second AND gate circuit of said five two-input AND gate circuits has one logic input signal corresponding to an air brake cylinder pressure of a vehicle and has another logic input signal supplied by said first AND gate circuit.

13. The dynamic diagnostic operational dump valve fault-detection system as defined in claim 12, wherein a third AND gate circuit of said five two-input AND gate circuits has one logic input signal proportional to an electric force motor current of the vehicle and has another logic input signal supplied by said first AND gate circuit.

14. The dynamic diagnostic operational dump valve fault detection system as defined in claim 13, wherein a fourth AND gate circuit of said five two-input AND gate circuits has one logic input signal representing the present status of a brake cylinder transducer of the vehicle and has another logic input signal supplied by said second AND gate circuit.

15. The dynamic diagnostic operational dump valve fault-detection system as defined in claim 14, wherein a fifth AND gate circuit of said five two-input circuits has one logic input signal represent the present status of the brake cylinder transducer. of the vehicle and has another logic input signal supplied by said third AND gate circuit.

16. The dynamic diagnostic operational dump valve fault detection system as defined in claim 1, wherein said second logic network means includes at least two two-input AND gate circuits.

17. The dynamic diagnostic operational dump valve fault-detection system as defined in claim 1, wherein said third logic network means includes at least four two-input AND gate circuits.

18. The dynamic diagnostic operational dump valve fault-detection system as defined in claim 1, wherein said fourth logic circuit means includes at least one two-input AND gate circuit.

19. The dynamic diagnostic operational dump valve fault-detection system as defined in claim 1, wherein said magnet valve state comparison circuit includes one input signal corresponding to an air brake cylinder pressure of a vehicle and has another input signal corresponding to the status of a magnet valve coil feedback.

20. The dynamic diagnostic operational dump valve fault-detection system as defined in claim 19, wherein said fourth logic network includes at least one two-input AND gate circuit which has one logic input signal supplied by said magnet valve comparison state comparison circuit and has another logic input signal representative of the highest axle speed of a vehicle.

21. Dump valve operational fault-determination arrangement comprising, a first multiple-stage AND logic network for receiving a plurality of logical input signals representative of various operating conditions of a railway vehicle, said first multiple-stage AND logic network supplying a logic output signal to a release reset circuit and supplying a logic output signal to an applied reset circuit, said release reset circuit is connected to a release timer circuit and to a release flag circuit, said applied reset circuit is connected to an applied timer circuit and to an applied flag circuit, said release timer circuit and said release flag circuit supplying a logic input signal to a second multiple-stage AND logic network and to a third multiple-stage AND logic network, said applied timer circuit and said applied flag circuit supplying a logic input signal to said second multiple-stage AND logic network and to said third multiple-stage AND logic network, said second multiple-stage AND logic network supplying a logic input signal to a release pressure check circuit which supplies a reset signal to said release flag circuit and supplying a logic input signal to an applied pressure check circuit which supplies a reset signal to said applied flag circuit, said third multiple-stage AND logic network and a single-stage AND logic network connected to an error output circuit which outputs an error signal to record and display a dump valve failure.

* * * * *